United States Patent [19]

Inaba et al.

[11] Patent Number: 5,937,316
[45] Date of Patent: Aug. 10, 1999

[54] SIC MEMBER AND A METHOD OF FABRICATING THE SAME

[75] Inventors: Takeshi Inaba; Syuichi Takeda; Masanori Sato, all of Yamagata, Japan

[73] Assignee: Toshiba Ceramics Co., Ltd., Tokyo, Japan

[21] Appl. No.: 08/879,702

[22] Filed: Jun. 20, 1997

[30] Foreign Application Priority Data

Jun. 21, 1996 [JP] Japan .................................. 8-161919

[51] Int. Cl.$^6$ .................................................. C30B 23/00
[52] U.S. Cl. ........................... 438/488; 438/931; 117/88; 117/89
[58] Field of Search .................................. 438/488, 509, 438/795, 796, 931; 117/88, 89, 101; 427/162

[56] References Cited

U.S. PATENT DOCUMENTS

| | | | |
|---|---|---|---|
| 3,956,032 | 5/1976 | Powell et al. ........................... | 117/101 |
| 5,037,502 | 8/1991 | Suzuki et al. ............................ | 117/89 |
| 5,604,151 | 2/1997 | Goela et al. ........................... | 427/162 |
| 5,614,447 | 3/1997 | Yamaga et al. ........................ | 438/795 |

*Primary Examiner*—Chandra Chaudhari
*Assistant Examiner*—Keith Christianson
*Attorney, Agent, or Firm*—Finnegan, Henderson, Farabow, Garrett & Dunner, L.L.P.

[57] ABSTRACT

The present invention is a SiC member and fabrication method thereof useful for heat treating semiconductors, wherein at least the surface of the member comprises: CVD-β-phase SiC columnar crystals grown in perpendicular to the surface of the member; and CVD-α-phase SiC crystals grown up from interface of CVD-β-phase columnar crystals. This structure thereby makes it possible to reduce the infrared ray transmittance of the heat treatment member and facilitates the heating of the heat treatment member by absorbing the infrared rays. Absorption of the IR rays results in favorable the temperature follow-up characteristics during the heat treatment of a semiconductor.

17 Claims, 9 Drawing Sheets

SIC MEMBER AND A METHOD OF FABRICATING THE SAME

BACKGROUND OF THE INVENTION

1. Field of the Invention

The present invention relates to a SiC member useful for heat treating semiconductors and a method of fabricating the same.

2. Description of the Prior Art

Since silicon carbide excels in heat resistance, the frequency of its use is increasing for applications that include, for example, a susceptor, a wafer holder, a thermal uniformity plate, a thermal uniformity ring, and a dummy wafer. To obtain silicon carbide with purity levels equivalent to that of quartz glass to be used for such applications, generally a CVD-SiC film (CVD-SiC film silicon carbide film formed by the method of Chemical Vapor Deposition) is formed on the surface of an SiC substrate. Further, to increase the purity of the CVD-SiC film, a CVD-SiC film can be formed on a substrate such as carbon which substrate can then be removed by oxidation, leaving a single substance of CVD-SiC.

The CVD-SIC film has a very small impurity content, and exhibits a yellow color or a green color which is the color intrinsic to SiC. The semi-transparent nature of a thin CVD-SiC film is evidence of the high transmittance of light through the CVD-SIC film in the visible ray region or its neighboring frequency region.

In semiconductor manufacturing, particularly in the single wafer heat treatment process in which wafers are processed one by one, a rapid thermal process (RTP) is adopted. Such a process uses an infrared lamp as a heat source to improve the temperature throughput. However, to uniformly increase the wafer temperature rapidly, the heat treatment members used in this process must also be heated correspondingly. In other words, a favorable heat response characteristic is required of the heat treatment members.

Recently, a single CVD-SIC material was employed in the RTP as a means to obtain a high-purity and low-heat-capacity heat treatment member for semiconductors. An important consideration in this process is the infrared ray transmittance of the CVD-SiC material. If the CVD-SiC has a sufficiently high purity, it is able to transmit not only visible light but also light in the infrared region. Generally, CVD-SiC absorbs a small amount of infrared rays. For this reason, heat treatment members formed from CVD-SiC are more difficult to heat than the wafer. As a result, a temperature distribution occurs in the wafer, resulting in slip in the wafer.

SUMMARY OF THE INVENTION

The object of the present invention is to obtain a member which makes it possible to reduce the infrared ray transmittance of the member and facilitate the heating of the member by absorbing the infrared rays. Such absorption characteristics result in favorable temperature follow-up characteristic during the heat treatment of a semiconductor.

In accordance with the first object of the present invention, the following are provided: a SiC member, wherein at least the surface of the member comprises: CVD-$\beta$-phase SiC columnar crystals grown perpendicular to the surface of the member; and CVD-$\alpha$-phase SiC crystals grown up from the interface of the CVD-$\beta$-phase columnar crystals.

In accordance with the second object of the present invention, the following are provided: the SiC member, wherein each of the CVD-$\beta$-phase SiC columnar crystals has a length between 0.1 and 1mm.

In accordance with the third object of the present invention, the following are provided: the SiC member, wherein each of CVD-$\alpha$-phase SiC columnar crystals has a diameter between 0.5 and 5 $\mu$m.

In accordance with the fourth object of the present invention, the following are provided: the SiC member, wherein a maximum transmittance of infrared rays with a wavelength of 2.5 to 20 $\mu$m in an infrared region is 5% or less.

In accordance with the fifth object of the present invention, the following are provided: the SiC member, wherein a content of each metallic element impurity contained in the member is 0.3 ppm or less.

In accordance with the sixth object of the present invention, the following are provided: the SiC member, wherein the member has a thickness between 0.1 and 1 mm.

In accordance with the seventh object of the present invention, the following are provided: the SiC heat treatment member for semiconductors, wherein the member is plate-shaped or hollow-shaped, and is formed of a single composition of CVD-SiC.

In accordance with the eighth object of the present invention, the following are provided: the SiC heat treatment member for semiconductors, wherein the member is a susceptor, a wafer holder, a thermal uniformity plate, a thermal uniformity ring, and a dummy wafer.

In accordance with the ninth object of the present invention, the following are provided: the method of fabricating a SiC member by chemical vapor deposition, comprising the steps of: heating a substrate in a reaction chamber at a treatment temperature from 1100 to 1150° C.; supplying a raw-material gas onto the substrate in the reaction chamber while changing the amount of gas supply such that a ratio of a maximum amount of the gas supply to a minimum amount of the gas supply is set to 5 times or more; and depositing a CVD-SIC layer on the substrate.

In accordance with the tenth object of the present invention, the following are provided: the method of fabricating a SiC member by chemical vapor deposition, wherein the step of supplying a raw-material gas is controlled so the maximum amount of the gas remains for a period of shorter than 60 seconds.

In accordance with the eleventh object of the present invention, the following are provided: the method of fabricating a SiC member by chemical vapor deposition, wherein the step of supplying a raw-material gas wherein the time interval from the beginning to the end of the period of the supply of the maximum amount of the gas is shorter than 180 seconds.

In accordance with the twelfth object of the present invention, the following are provided: the method of fabricating a SiC member by chemical vapor deposition, shorter than 180 second wherein the time interval from the end of the period of maximum gas supply to beginning of, the gas supply is shorter than 180, or more preferably 60 seconds.

In accordance with the thirteenth object of the present invention, the following are provided: the method of fabricating a SiC heat treatment member for semiconductor by chemical vapor deposition recited in the tenth object wherein the step of supplying a raw-material gas is supplied in a succession of square pulses such that the period of supplying the maximum amount of gas is equal to the period of the supplying minimum amount of gas.

In accordance with the fourteenth object of the present invention, the following are provided: the method of fabricating a SiC heat treatment member for semiconductor by chemical vapor deposition, further comprising a step of: removing the substrate thereby obtaining a plate-shaped or hollow-shaped single substance of CVD-SiC.

In accordance with the fifteenth object of the present invention, the following are provided: the SiC heat treatment member for semiconductor made by the method of recited in the object of the tenth invention.

In accordance with the sixteenth object of the present invention, the following are provided: the SiC heat treatment member for semiconductor made by the method of the eleventh object of the invention.

Preferably, the heat treatment member for semiconductor in the present invention is high-purity CVD-silicon carbide, and the content of each impurity metallic element contained therein is 0.3 ppm or less. If the content of each metal contained as an impurity exceeds 0.3 ppm, an adverse effect is exerted on the characteristics of the semiconductor as a result. In addition, the thickness of this member is between 0.1 and 1 mm. If the thickness is less than 0.1 mm, the strength becomes weak and is therefore inappropriate as a member. On the other hand, if the thickness exceeds 1 mm, the heat capacity becomes large, and a member having such a thickness is inappropriate for RTP, since it requires extended processing times, leading to higher costs.

In the CVD-SiC film, polycrystals generally grow perpendicular to the substrate surface. Accordingly, grain boundaries are also present in this direction. Since the grain boundaries are located substantially parallel to incident light, the extent to which the transmission of light is hampered is small. As a result, a fixed amount of infrared rays is always transmitted through such a member.

Accordingly, an arrangement is provided such that CVD crystals, i.e., grain boundaries are allowed to grow not only in a perpendicular direction to the substrate surface but also in a parallel direction to the substrate surfaces. Such an arrangement of grain boundaries which are positioned perpendicular to the incident light prevents the transmission of incident light. This resultant absorption of the infrared rays promotes heating of the member.

As for the infrared ray transmittance of CVD-SiC in the present invention, the maximum transmittance of infrared rays with a wavelength of 2.5 to 20 μm in an infrared region is set to be 5% or less. This requirement is determined by taking into consideration the temperature follow-up characteristic of the material subject to heat treatment when the material is used as the heat treatment member for semiconductors.

Namely, experiments have confirmed that, by setting the infrared ray transmittance to be 5% or less, the heat treatment member absorbs the infrared rays during heating in RTP which results in a temperature equivalent to the wafer. This temperature equivalence between the wafer and heat treatment member make it possible to suppress the occurrence of slip in the wafer. In addition, the wavelength range of between 2.5 and 20 pm in the infrared region is selected is because of the wavelength region of an infrared lamp. The invention is illustrated and described in greater detail as follows.

DESCRIPTION OF THE PREFERRED EMBODIMENT

Figure 1:
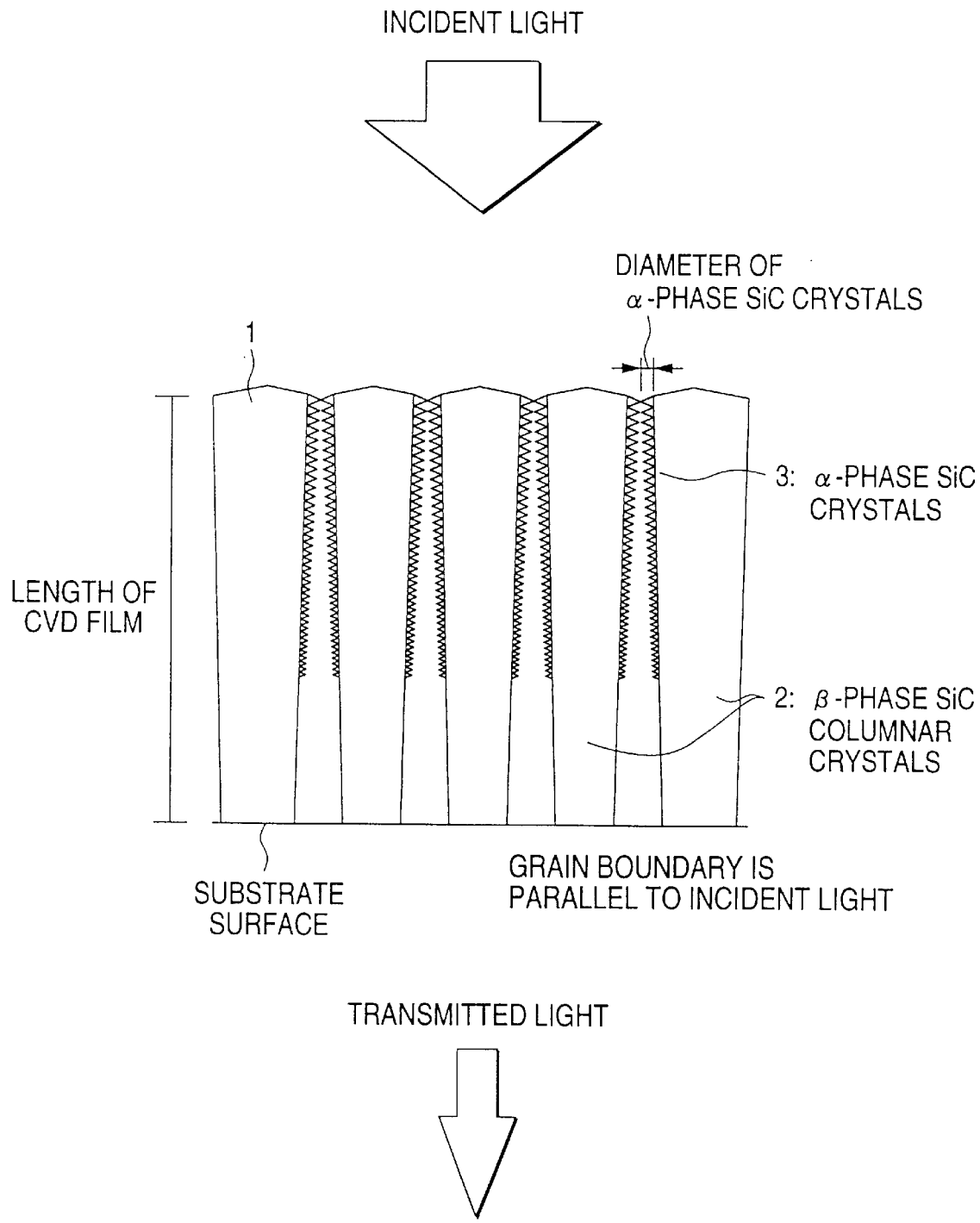
FIG. 1 is an explanatory diagram, in enlarged form, of the crystalline structure of a CVD-SiC film of the heat treatment member for semiconductors formed of high-purity CVD-SIC in accordance with the present invention.
Figure 2:
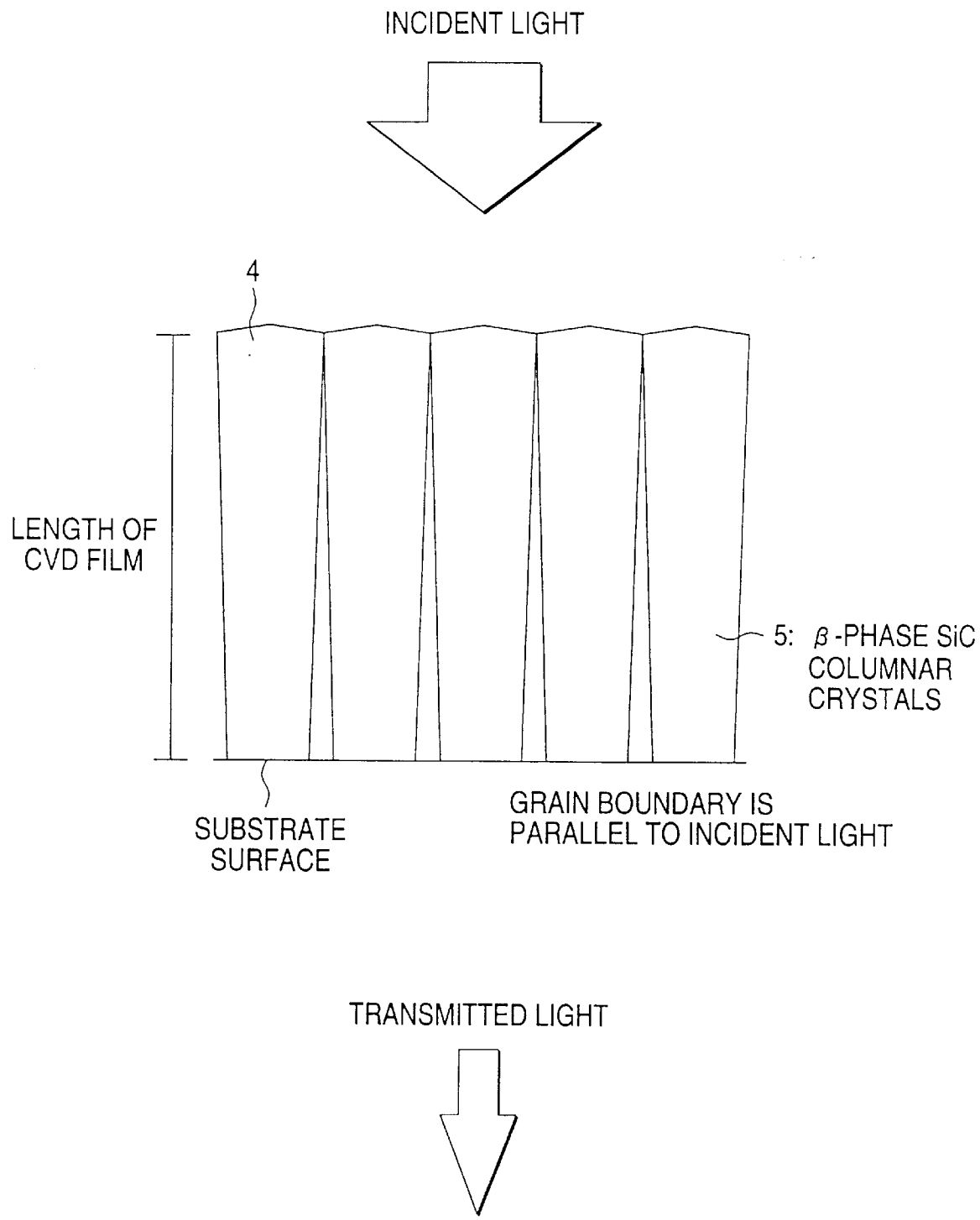
FIG. 2 is an explanatory diagram, in enlarged form, of the crystalline structure of a CVD-SiC film of a conventional heat treatment member for semiconductors formed of CVD-SiC.

FIG. 1 is an explanatory diagram, in enlarged form, of the crystalline structure of CVD-SiC of the heat treatment member for semiconductors in accordance with the present invention. In FIG. 1, reference numeral 1 denotes CVD-SiC. As shown in the drawing, CVD-SiC in the present invention consists of columnar crystals 2 of β-SiC whose grain boundaries are parallel to the incident light and fine crystals 3 of α-SiC whose grain boundaries are perpendicular to the direction of the incident light. FIG. 2 shows conventional CVD-SiC 4 which consists of only columnar crystals 5 of β-SiC whose grain boundaries are parallel to the incident light. Here, fine crystals of α-SiC whose grain boundaries are perpendicular to the direction of the incident light are not present.

Figure 3:
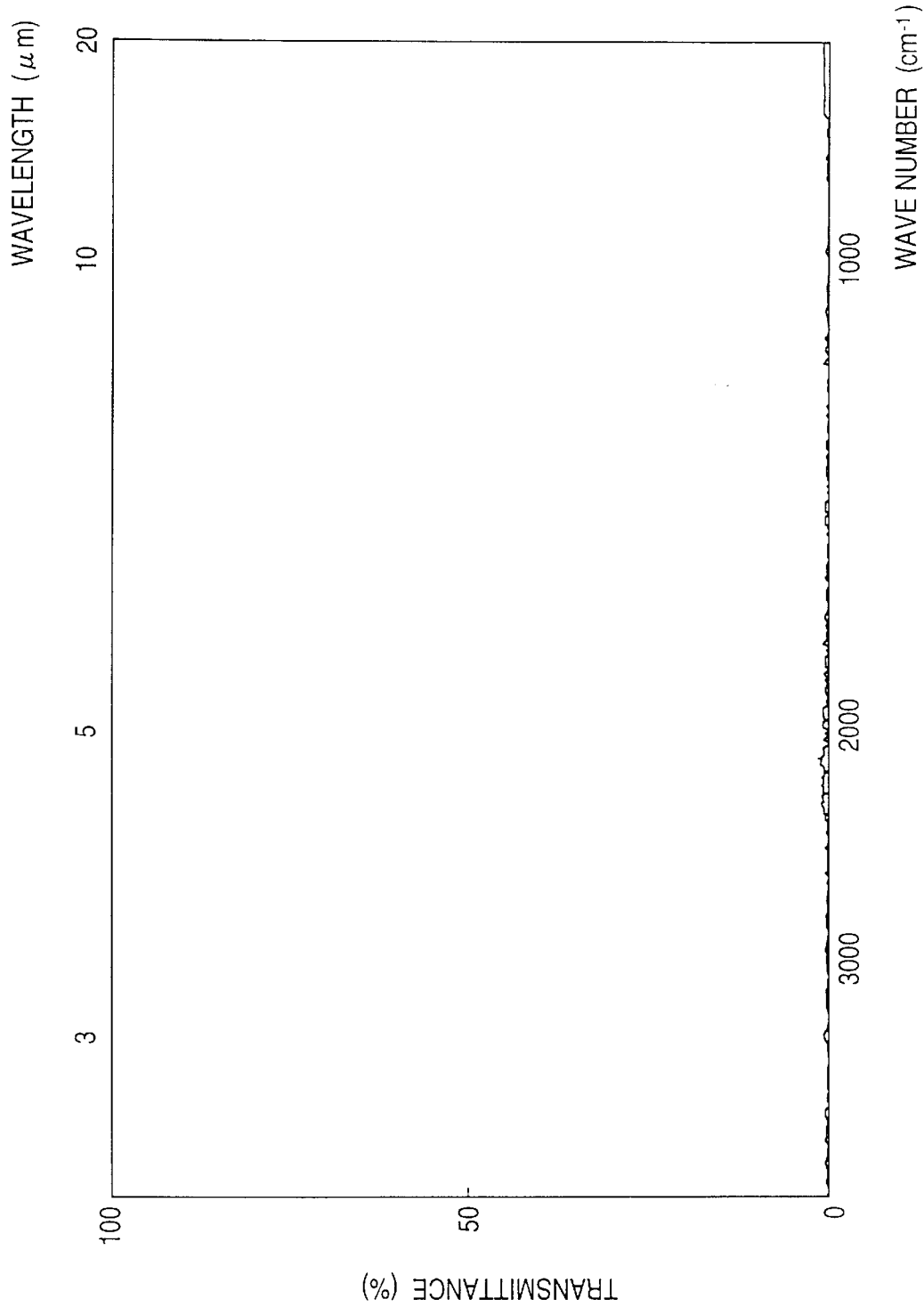
FIG. 3 is a diagram illustrating the relationship between the wavelength and the infrared ray transmittance of the heat treatment member formed of CVD-SiC in accordance with the present invention.
Figure 4:
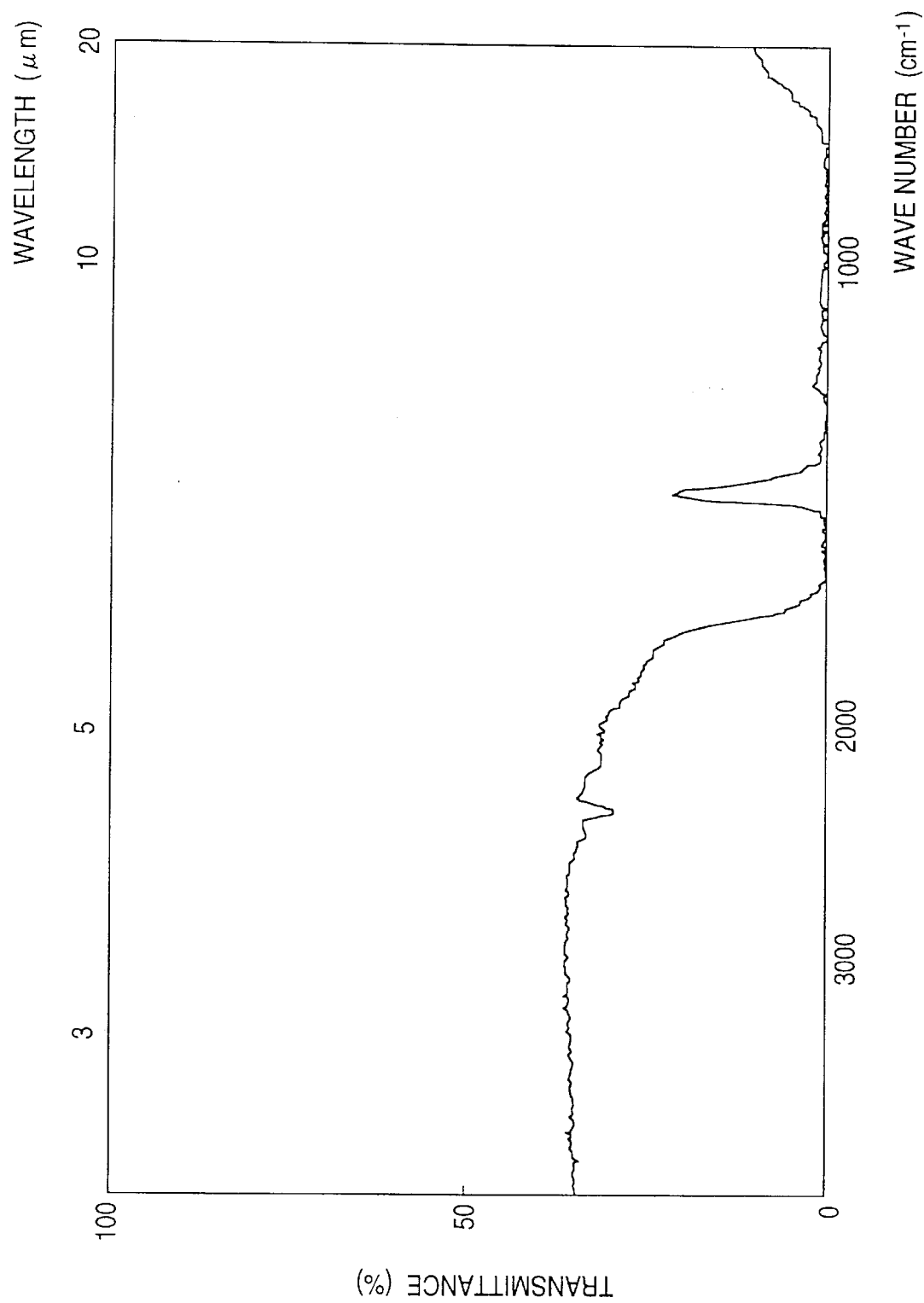
FIG. 4 is a diagram illustrating the relationship between the wavelength and the infrared ray transmittance of the conventional heat treatment member formed of CVD-SiC.

FIG. 3 shows an example in which the transmittance of infrared rays, with the wavelength of 2.5 to 20 μm, of CVD-SiC used in the heat treatment member in the present invention is measured by an infrared-transmittance measuring apparatus. As is also evident from this drawing, the infrared ray transmittance of CVD-SiC in the invention of this application is less than 1% in the illustrated overall wavelength region. FIG. 4 shows an example in which the transmittance of infrared rays, with the wavelength of 2.5 to 20 pm, of a conventional example of CVD-SiC is similarly measured by the infrared-transmittance measuring apparatus. FIG. 4 shows that the infrared ray transmittance of the conventional CVD-SiC reaches as much as 35% at maximum.

Figure 5:
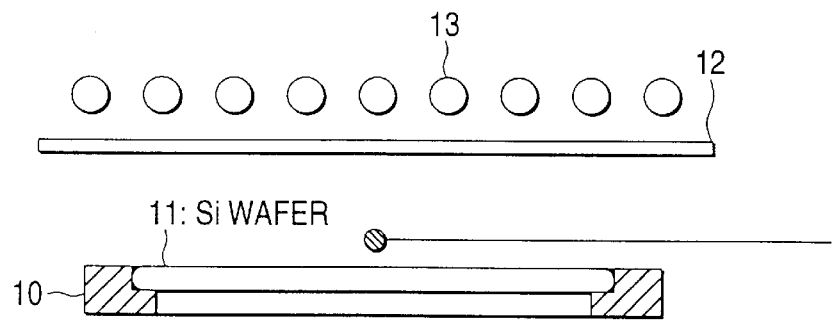
FIG. 5 is an explanatory diagram illustrating an experiment of heat treatment conducted by using the heat treatment member.
Figure 6:
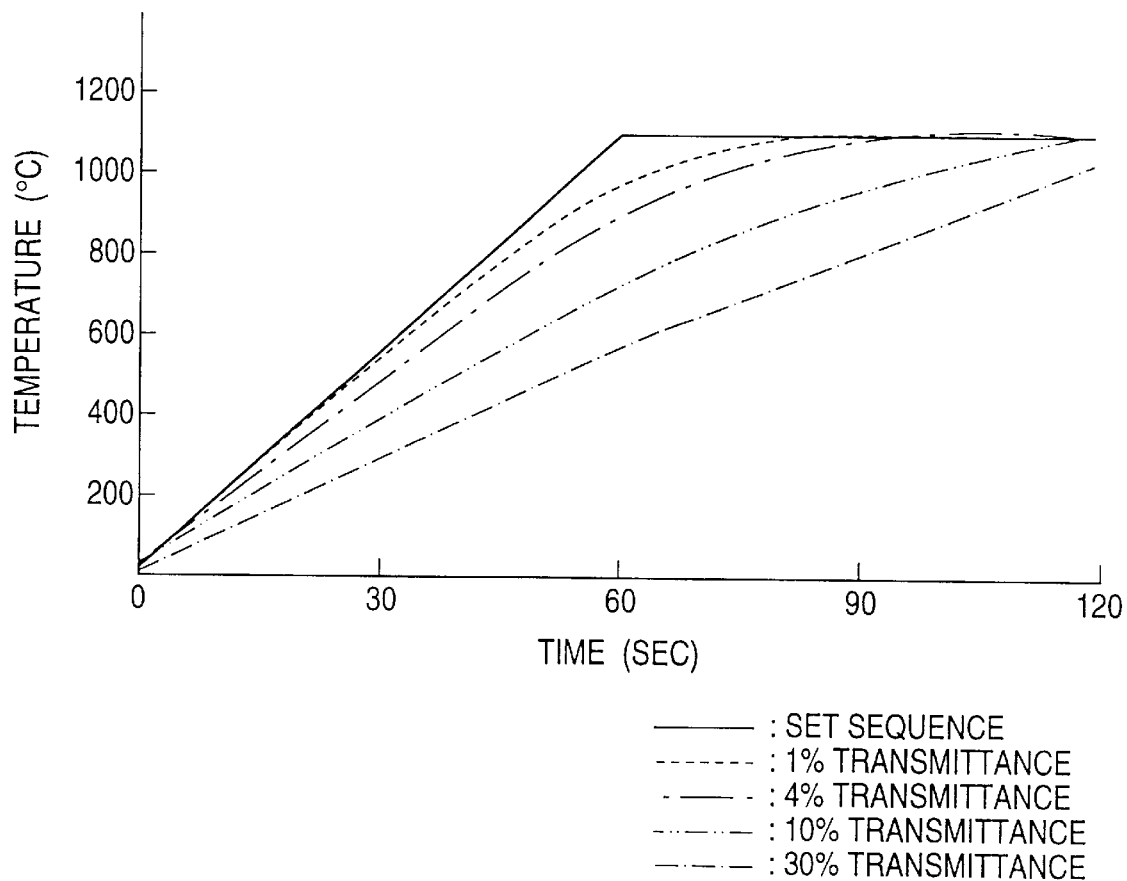
FIG. 6 is a diagram illustrating the relationship between the time and the temperature rise due to the difference in the infrared ray transmittance.

Further, a test was conducted on the temperature follow-up characteristic of the heat treatment member in accordance with the present invention by using an experimental apparatus shown in FIG. 5. In this experiment, as shown in FIG. 5, a silicon wafer 11 was set on a susceptor 10 fabricated from a single substance of CVD-SiC with various infrared ray transmittances, and heat treatment was carried out from above by an infrared lamp 13 through a quartz window 12. The results are shown in FIG. 6. As shown in FIG. 6, in cases where the susceptors whose infrared ray transmittances were below 5% were used, i.e. 1% (chain line) and 4% (dotted chain line) the temperature follow-up characteristic was favorable.

The silicon wafer was subjected to heat treatment by using the experimental apparatus shown in FIG. 5, and the length of slip occurring in the wafer surface was examined. The heat treatment conditions conformed to the sequence shown in FIG. 6. A maximum length of slip occurring in the wafer after heat treatment was measured, and a relationship between the same and the infrared ray transmittance of the susceptor was examined. The results are shown in Table 1. As is also apparent from Table 1, it can be appreciated that it is possible to obtain favorable wafers with short slip length when susceptors whose infrared ray transmittances below 5% were used i.e., 1% and 4%.

TABLE 1

Relationship Between Infrared Transmittance and Slip Length

| Maximum Infrared Transmittance (%) | Slip Length (mm) |
|---|---|
| 1 | 10 |
| 4 | 15 |
| 10 | 120 |
| 30 | 250 |

As described, by setting the maximum transmittance of infrared rays, with the wavelength of 2.5 to 2 $\mu$m in the infrared region, of CVD-SiC to be 5% or possible to possible to obtain a heat treatment member which is more difficult to transmit the infrared rays than in the conventional case, and allows more heating through the absorption of the infrared rays than in the conventional case.

The heat treatment member for semiconductors formed of a high-purity CVD-SiC material in accordance with the invention of this application is preferably plate-shaped or a hollow shaped and consists of single composition of CVD-SiC by forming a CVD-SiC film on a substrate formed of such as carbon and then by removing the substrate by oxidation. The oxidation and removal of the substrate can be easily carried out by an ordinary method which is conventionally practiced. As a result, the heat capacity of the heat treatment member can be reduced to obtain an excellent heat treatment member for semiconductors. Examples of such heat treatment member for semiconductors include a susceptor, a wafer holder, a thermal uniformity plate, a thermal uniformity ring, and a dummy wafer.

The invention further includes a method of fabricating the aforementioned heat treatment member for semiconductor formed of a high-purity CVD-SiC material. The method of fabricating CVD-SiC herein is basically identical to the conventional method of fabricating a CVD-SiC film. Namely, a substrate such as carbon is placed in a reaction tube formed of quartz glass or the like, and is heated. Raw-material gases are then supplied into the reaction tube to form a precursor, thereby allowing an SiC film to be chemically deposited on the substrate.

In the present invention, the raw-material gases are supplied intermittently at intervals of 60 seconds or less with a heating temperature set to 1100 to 1150° C., and the ratio of the maximum amount of gas supply to the minimum amount of gas supply is set to 5 times or more. If the heating temperature is less than 1100° C., the $\alpha$-phase is not formed, whereas if it exceeds 1150° C., the grains of the formed $\alpha$-phase becomes coarse, resulting in an increase in the transmittance. The supply of the raw-material gases is produced intermittently in a pulse-like manner. The interval is set to 60 seconds or less, preferably in the range of 10 to 50 seconds. If the interval exceeds 60 seconds, the $\alpha$-phase grows perpendicular to the substrate, resulting in a further increase in the transmittance. When the raw-material gases are supplied intermittently, it is necessary to set the ratio of the maximum amount of gas supply to the minimum amount of gas supply to 5 times or more. If this ratio is less than 5 times, the $\alpha$-phase is liable to grow perpendicular to the substrate as in the case of the intermittent time, resulting in an increase in the transmittance. Such a setting is therefore undesirable.

As described above, by controlling the processing conditions, it is possible to grow $\beta$-phase SiC columnar crystals in perpendicular to the surface of the substrate and grow a-phase SiC crystals in perpendicular direction from the side boundary of the $\beta$-phase SiC columnar crystals. Therefore it is possible to allow the grain boundaries of CVD-SiC to grow not only in a perpendicular direction to the substrate but also in a parallel direction to the substrate.

Hereafter, a further description will be given of the crystal growth.

Figure 7:
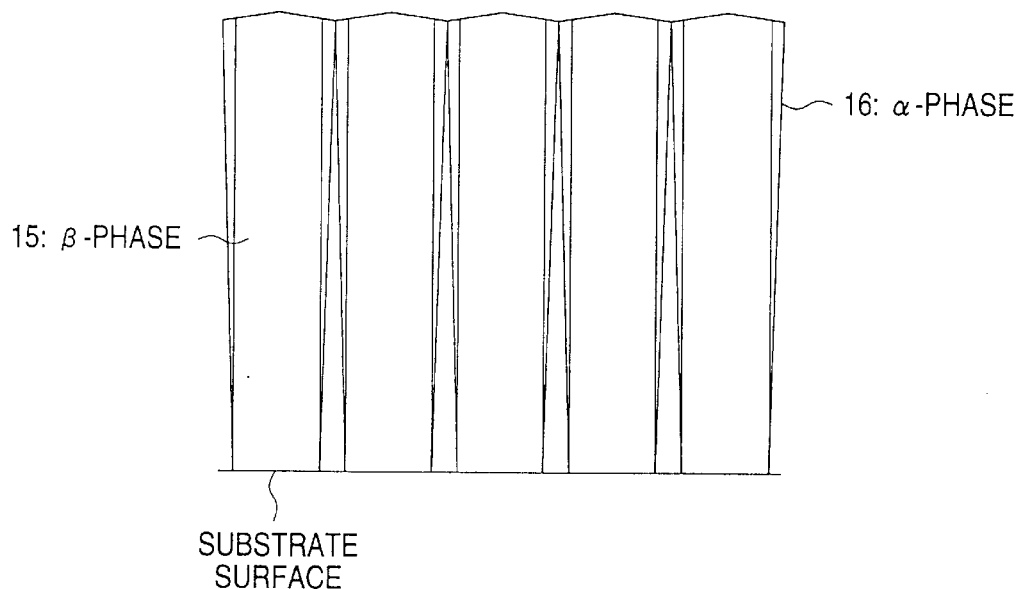
FIG. 7 is an explanatory diagram illustrating the formation of the α-phase and the β-phase of CVD-SiC.

Generally, in CVD-SiC, if the treatment temperature is low, fine crystals grow. Conversely, if the treatment temperature is conversely high, coarse crystals grow. In addition, although the SiC crystal is broadly classified into two types, the $\beta$-phase (columnar crystal) and the a-phase (granular crystal), the $\beta$-phase starts to grow at a relatively low temperature, while the $\alpha$-phase is formed in a high temperature range. Both phases may coexist in an intermediate range there between. The CVD-SiC shown in FIG. 7 is an example of the conventional SiC in the a $\beta$-phase 15 and a $\alpha$-phase 16 coexist. Here, columnar crystals which grow in the perpendicular direction to the substrate are the $\alpha$-phase 15, while fine crystals which grow in the perpendicular direction to the substrate are the $\alpha$-phase 16.

Figure 8:
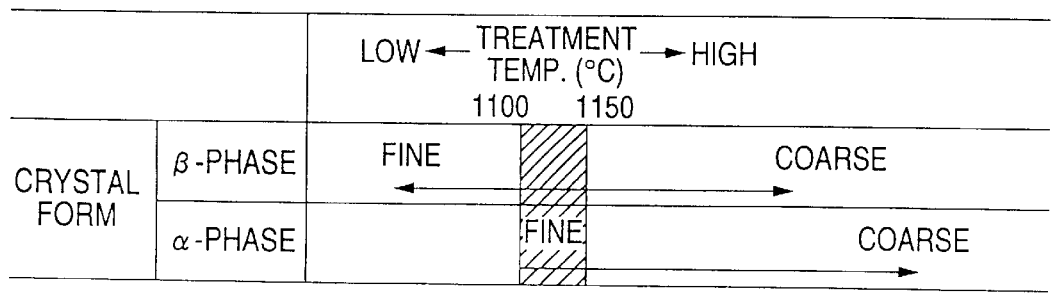
FIG. 8 is an explanatory diagram illustrating the concept of the crystal growth of SiC.

As the conditions for allowing the crystals to grow into the crystalline structure such as the one shown in FIG. 1, the present inventor studied the temperature condition in the first place. As a result, it was confirmed that a relationship such as the one shown in FIG. 8 is present between the temperature during the crystal growth and the crystalline form. FIG. 8 illustrates a conceptual diagram on the relationship between the treatment temperature and the $\beta$-phase (columnar crystal) and the $\alpha$-phase (granular crystal) of the formed SiC crystal.

According to this diagram, there is a tendency that the $\beta$-phase becomes fine if the treatment temperature is low, and becomes coarse if the treatment temperature is high. On the other hand, the a-phase is fine if the treatment temperature is in the range of 1100 to 1150° C., and becomes coarse if the treatment temperature is in a high range. From this fact, it can be appreciated that, to obtain a crystal in which the fine $\alpha$-phase coexists with the large columnar crystal ($\beta$-phase) as shown in FIG. 1, the temperature range of 1100 to 1150° C. is optimal. However, even if the eutectoid a-phase is fine, if it grows in the perpendicular direction to the substrate in the same way as the α-phase, it is impossible to obtain the crystal such as the one shown in FIG. 1.

Accordingly, the present inventor found that it is possible to obtain a method of allowing the a-phase to grow parallel to the substrate if the raw-material gases are supplied intermittently, i.e., in a pulse-like manner.

Since the treatment temperature of 1100 to 1150° C. is a relatively stable region for the β-phase, even if the raw-material gases are introduced in the pulse-like manner, the effect on the crystal growth is small, and the crystal grows in a direction perpendicular to the substrate. On the other hand, in the case of the α-phase, as the nucleation and the crystal growth are alternately repeated by the pulse-like introduction of the raw-material gases, the crystal cannot grow perpendicular to the substrate. Rather, the crystal beneficially grows perpendicular to the β-phase by assuming the β-phase to be the substrate. The interval in the pulse-like introduction in this case is preferably 60 seconds or less, and it is necessary to set the ratio between the maximum amount of gas supply and the minimum amount of gas supply to 5 times or more.

An examination was made into the relationship among the treatment temperature, the presence or absence of the pulse-like introduction, and the infrared ray transmittance, and the results are shown in Table 2.

TABLE 2

Relationship Among Treatment Temperature, Presence or Absence of Pulse-like Introduction, an Infrared Ray Transmittance

| | Treatment Temperature (° C.) | Pulse-Like Introduction | Infrared Ray Transmittance |
|---|---|---|---|
| Specimen 1 Present Invention | 1110 | present | 1 |
| Specimen 2 Present Invention | 1140 | present | 4 |
| Specimen 3 Conventional Piece | 1140 | absent | 10 |
| Specimen 4 Conventional Piece | 1200 | absent | 30 |

Embodiment 1

Figure 9:
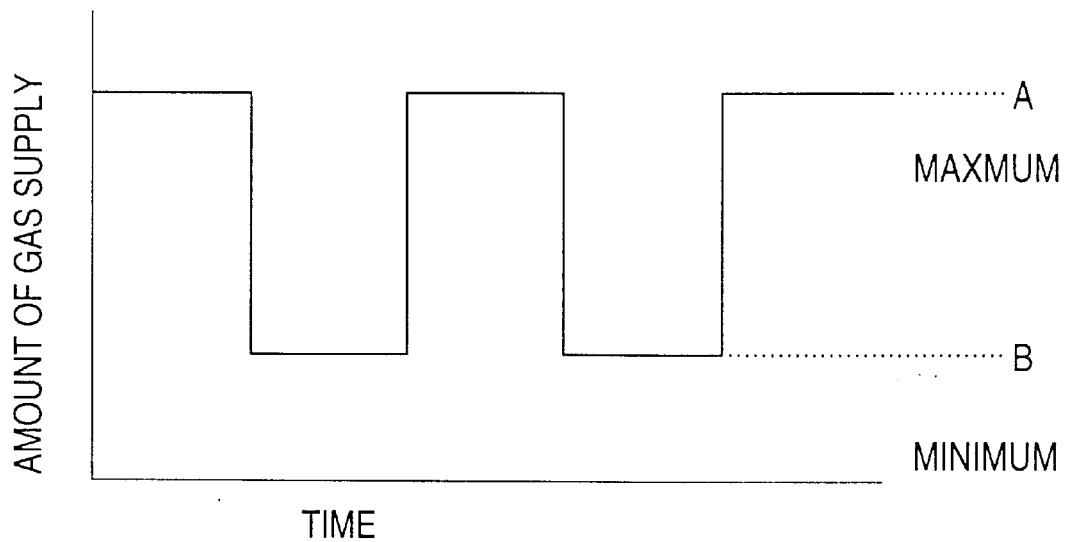
FIG. 9 is a diagram illustrating the relationship between the time and the amount of gas supply in first embodiment of the present invention.

A quartz glass reaction tube around which a high-frequency coil is wound is provided with a heat generating portion (heater), a raw-material gas introducing portion, and a vacuum exhaust system. A CVD-SiC film was allowed to be formed on a carbon substrate on a table. As the raw-material gases, a mixed gas of dicrorosilane (DCS:SiCH$_2$Cl$_2$) as a silane-based gas and methane (CH$_4$) as a hydrocarbon gas, were used with flowing hydrogen as a carrier gas. The gases were supplied in a square pulse-like manner in 30-minute intervals as shown FIG. 9. In FIG. 9, "A" represents a maximum amount of total gas supply of SiCH$_2$Cl$_2$ and CH$_4$, and "B" represents a minimum amount of total gas supply of SiCH$_2$Cl$_2$ and CH$_4$. In the maximum supply period, the amount of CH$_2$Cl$_2$ gas supply is 1.8 SLM and the amount of CH$_4$ gas supply is 0.9 SLM. In the minimum supply period, the amount of CH$_2$Cl$_2$ gas supply is 0.3 SLM and the amount of CH$_4$ gas supply is 0.1 SLM. The ratio of the maximum amount of gas supply to the minimum amount of gas supply at that time was set to 6 times, and the amount of H$_2$ gas supply is constant at 9.0 SLM. The heating temperature as set in the range of 1110 to 1140°. As a result, a CVD-SiC plate having a thickness of 0.5 mm was obtained. Subsequently, the CVD-SiC plate was removed from the reaction tube, and carbon on the CVD-SiC substrate was removed by oxidation, thereby obtaining a plate-shaped CVD-SiC substrate in accordance with the present invention.

When the transmittance of infrared rays with the wavelength of 2.5 to 20 μm in the case of this CVD-SiC substrate was measured by the infrared-transmittance measuring apparatus, the transmittance was in the range of 1 to 4% over the entire range.

When this CVD-SiC substrate was heated by an infrared lamp, the temperature follow-up characteristic was more favorable than a CVD-SiC substrate fabricated in the conventional method and having an infrared ray transmittance of 10% or more, as shown in FIG. 6 referred to earlier.

The appropriate amount of gas supply depends on the volume of the reaction chamber. In the maximum gas supply period, the ratio of hydrogen concentration to silicon concentration is appropriately more than 3 times and less than 10 times. When the ratio is less than 3 times, a granular layer is deposited. And when he ratio is more than 10 times, raw gas concentration is too low and it is difficult to grow α-phase. In the maximum amount of gas supply and the minimum amount of gas supply at that time was set to 6 times.

Figure 10:
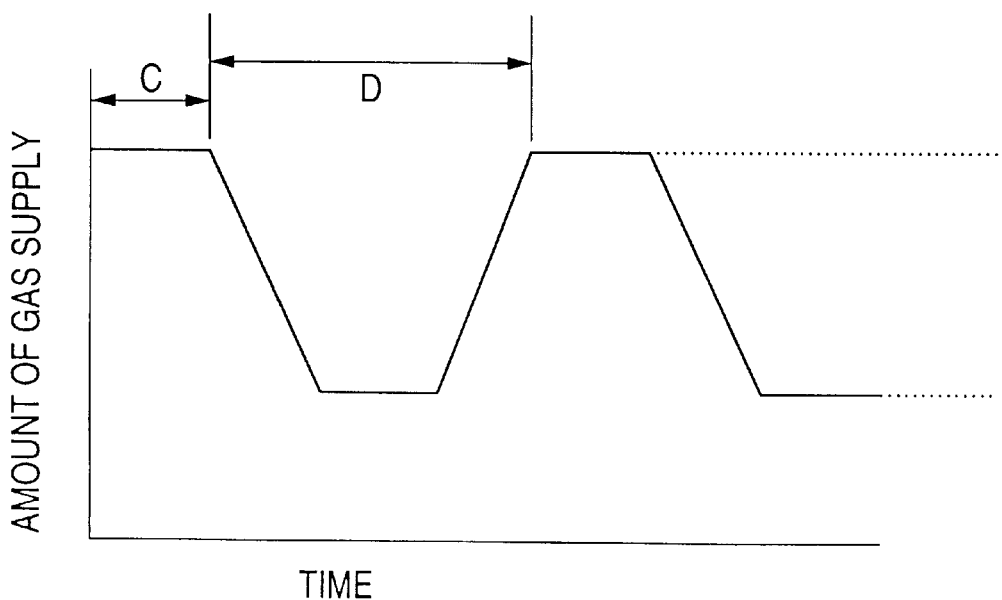
FIG. 10 is a diagram illustrating the relationship between the time and the amount of gas supply in second embodiment of the present invention.
Figure 11:
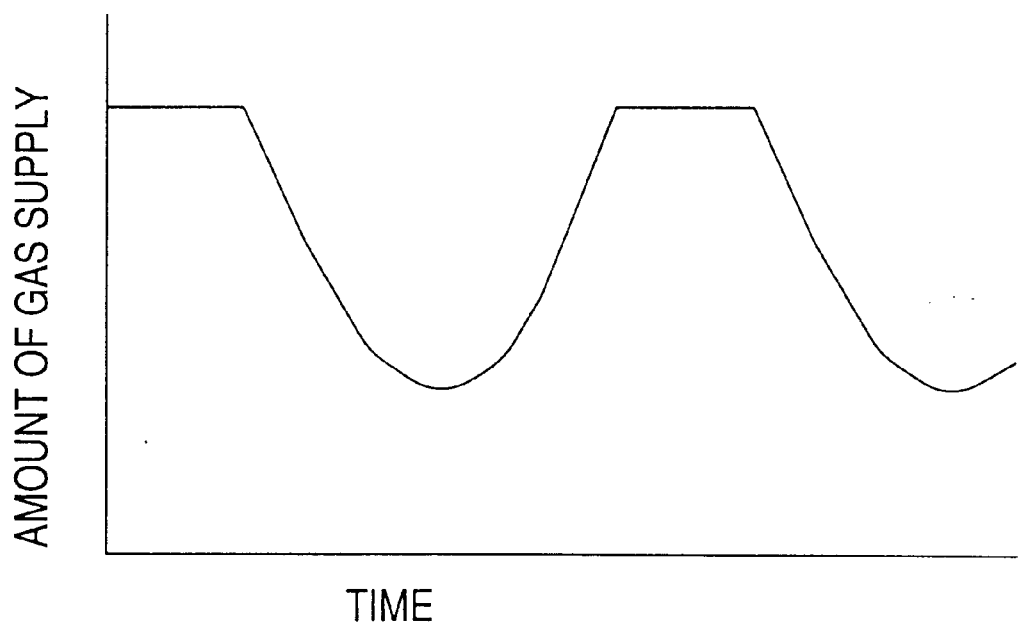
FIG. 11 is a diagram illustrating the relationship between the time and the amount of gas supply in third embodiment of the present invention.

FIGS. 10, and 11 represent second and third embodiments of gas supply chart in the case of changing an amount of gas supply gradually respectively. In the case, an amount of gas supply changes gradually.

In FIG. 11, "C" represent a period of the maximum amount of the gas supply and "D" represent a time interval from end of the period of the maximum amount of the gas supply to beginning of that time. When the period of the maximum amount of the gas supply "C" is longer than 60 second, a grain size of β-phase SiC is grown exceedingly large and thereby the transmittance of the material is too high.

Figure 12:
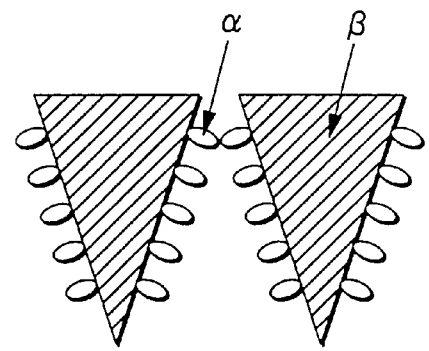
FIG. 12 is an explanatory diagram illustrating the formation of the α-phase and the β-phase of CVD-SiC, and time interval between end of maximum amount of gas supply and beginning of next maximum amount of gas supply.
Figure 12:
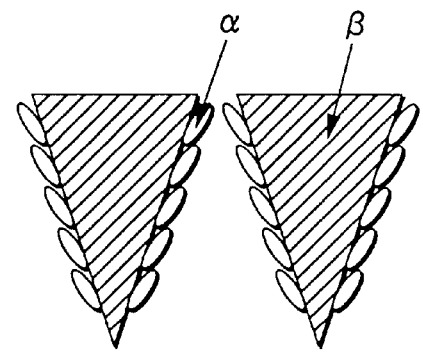
Figure 12:
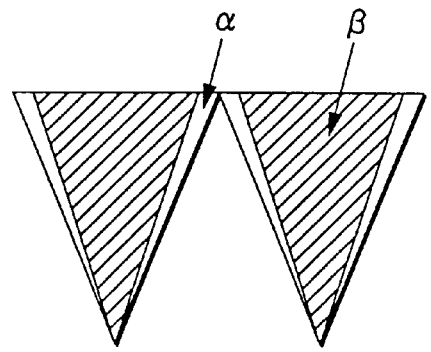

FIG. 12 represents an explanatory diagram illustrating the relationship of the formation of the α-phase and the β-phase of CVD-SiC, and time interval "D". As "D" increases, as shown FIG. 12 under (a)–(c), a grain size of grown α-phase SiC gradually grow larger perpendicular to the substrate surface. Therefore as "D" increases beyond 180 seconds, α-phase SiC crystals grow exceedingly long perpendicular to the substrate surface. This results in transmittance of the material that is too high As described above in the heat treatment member for semiconductors formed of CVD-SiC in accordance with the present invention, the maximum transmittance of infrared rays with the wavelength of 2.5 to 20 μm in the infrared region is 5% or less. Therefore when a single wafer heat treatment is effected by infrared heating, this heat treatment member absorbs the infrared rays to improve the temperature follow-up characteristic. As a result, it is possible to achieve heat treatment more uniformly and favorably.

What is claimed is:

1. A SiC member wherein at least the surface of the member comprises:

β-phase SiC columnar crystals grown by CVD perpendicular to the surface of the member; and α-phase SiC crystals grown by CVD on the surface of said β-phase columnar crystals between said β-phase columnar crystals.

2. The SiC member as claimed in claim 1, wherein each of said β-phase SiC columnar crystals has a length of 0.1 to 1 mm.

3. The SiC member of claim 1, wherein said α-phase SiC columnar crystals have a diameter of 0.5 to 5 μm.

4. The SiC member of claim 2 wherein said α-phase SiC columnar crystals have a diameter of 0.5 to 5 μm.

5. The SiC member as claimed in claim 1, having a maximum transmittance of infrared rays with a wavelength in the range of from 2.5 to 20 μm being 5% or less.

6. The SiC member for semiconductor as claimed in claim 1 having an impurity metallic element content of 0.3 ppm or less.

7. The SiC member as claimed in claim 6, having a thickness in the range of from 0.1 to 1 mm.

8. The SiC member as claimed in claim 1, wherein the member is formed by CVD of SiC having a single composition of SiC formed.

9. The SiC member as claimed in claim 1, wherein the member is a susceptor, wafer holder, a thermal uniformity plate, a thermal uniformity ring, or a dummy wafer.

10. A method of fabricating a SiC member by chemical vapor deposition, comprising the steps of:

heating a substrate in a reaction chamber to a treatment temperature from 1100 to 1150° C.;

supplying a raw-material gas onto the substrate in the reaction chamber while changing the amount of gas supplied such that the ratio of the maximum amount of the gas supplied to the minimum amount of gas supplied is 5 times or more; and depositing a CVD-SiC layer on the substrate.

11. The method of claim 10, wherein the step of supplying the maximum amount of said raw-material gas is shorter than 60 seconds.

12. The method of claim 11, wherein the step of supplying the raw-material gas in a succession of pulses such that the time interval from end of a pulse of supplying the maximum amount of the gas to the beginning of next pulse is shorter than 180 seconds.

13. The method of claim 12, wherein the time interval from the end of said pulse to the beginning of the next pulse is shorter than 60 seconds.

14. The method of claim 11, wherein the raw-material gas is supplied in a succession of square pulses such that the period of supplying the maximum amount of gas is equal to the period of supplying the minimum amount of gas.

15. The method of fabricating a SiC member of claim 10 further comprising the step of removing the substrate and forming a plate-shaped or hollow-shaped SiC member having a single composition.

16. A SiC heat treatment member for semiconductors formed by the method of claim 11.

17. A SiC heat treatment member for semiconductors formed by the method of claim 15.

* * * * *